US006965252B2

(12) United States Patent
Shau

(10) Patent No.: US 6,965,252 B2
(45) Date of Patent: Nov. 15, 2005

(54) POWER SAVING METHODS FOR PROGRAMMABLE LOGIC ARRAYS

(76) Inventor: Jeng-Jye Shau, 911 Amarillo Ave., Palo Alto, CA (US) 94303

( * ) Notice: Subject to any disclaimer, the term of this patent is extended or adjusted under 35 U.S.C. 154(b) by 74 days.

(21) Appl. No.: 10/724,963

(22) Filed: Dec. 1, 2003

(65) Prior Publication Data

US 2004/0117754 A1 Jun. 17, 2004

Related U.S. Application Data

(60) Continuation-in-part of application No. 10/187,515, filed on Jul. 2, 2002, now Pat. No. 6,658,638, which is a division of application No. 09/966,141, filed on Sep. 27, 2001, now Pat. No. 6,492,835, which is a division of application No. 09/005,113, filed on Jan. 9, 1998, now Pat. No. 6,314,549.

(51) Int. Cl.[7] .............................................. H03K 19/177

(52) U.S. Cl. ............................. 326/41; 326/38; 716/16

(58) Field of Search ............................ 326/37, 38, 39, 326/40, 41; 716/16

(56) References Cited

U.S. PATENT DOCUMENTS 5,982,683 A * 11/1999 Watson et al. .............. 365/201

* cited by examiner

*Primary Examiner*—Daniel Chang
(74) *Attorney, Agent, or Firm*—Bo-In Lin

(57) ABSTRACT

The present invention provides novel power saving methods for programmable logic array (PLA) circuits that includes diodes. One method is to store the results of a previous PLA operation, and bypass a new operation if the inputs are the same as previous operation. Another method is to reset the PLA outputs when the correct results can be achieved by resetting output latches. A large PLA is divided into smaller sub-PLA's while individual sub-PLA's are controlled separately. It is therefore possible to save power by bypassing unrelated sub-PLA's. PLA's of the present invention consume less power than equivalent prior art PLA's by orders of magnitudes. For most cases, PLA's of the present invention also have better performance and better cost efficiency. The design procedures are completely controlled by user-friendly computer aid design tools. The regular structures of PLA and the simplicity in connections allow us to avoid RC effects of conductor lines. We are able to achieve full performance improvement as IC technologies continue to progress into smaller and smaller critical dimensions.

4 Claims, 14 Drawing Sheets

FIG. 1(d) Pri r Art

POWER SAVING METHODS FOR PROGRAMMABLE LOGIC ARRAYS

This Application is a Continuation-in-Part Application (CIP) of a patent application Ser. No. 10/187,515 filed on Jul. 2, 2002, which is a U.S. Pat. No. 6,658,638 patent application Ser. No. 10/187,515 claims a Priority Date of Sep. 27, 2001, and is a division of a Patent Application filed in U.S. Patent and Trademark Office with a Ser. No. 09/966,141 filed on Sep. 27, 2001 by the Applicant of this Application now U.S. Pat. No. 6,492,835. U.S. Pat. No. 6,492,835 is a division of application Ser. No. 09/005,113, filed Jan. 9, 1998, now U.S. Pat. No. 6,314,549.

FIELD OF THE INVENTION

The present invention relates to circuit design methods for programmable logic arrays, and more particularly to power saving methods for programmable logic arrays.

BACKGROUND OF THE INVENTION

Programmable logic array (PLA) circuits and gate array (GA) logic circuits are the most common building modules for integrated circuit (IC) logic products. After IC designers describe logic operations by hardware description language (HDL), computer aid design (CAD) tools automatically translate the HDL into PLA or gate array circuits. These two methods (PLA or GA) are exchangeable. Most of logic circuits can be implemented by either way. PLA CAD tools combine all the logic relationships between a large number of input and output signals into one large group of AND operations followed by one large group of OR operations, and represent those operations by arrays of programmable connections. The physical structure of a PLA is highly regular, and its timing is easily predictable. On the contrary, gate array CAD tools break down complex logic calculations into series of single step logic operations such as NAND, NOR, INVERT, and implement those logic operations by a large number of logic gates. Such procedure is called "synthesizing" in the art. The physical structures of GA logic circuits are nearly random. That is why they are often called "random logic circuits" in the art. It usually requires very complex connections between logic gates. As IC fabrication technologies progressed into deep submicron, the resistance of conductor lines and the coupling capacitors between conductors became significant. The complex connections in GA logic circuits make timing calibration and performance optimization very difficult even with the helps of the most advanced CAD tools. It is expected that future IC technologies will not be able to improve circuit performance by reducing transistor dimensions due to the resistance and capacitor (RC) of conductor lines. On the other hand, PLA adapts better for the RC problem in advanced IC technologies due to its regular structures. The limitation for PLA comes from its power consumption. PLA consumes much more power than GA. Power requirement makes it nearly impossible to implement a large logic circuit completely by PLA.

Before the invention itself is explained, a typical prior art PLA is first explained to facilitate the understanding of the invention. FIG. 1(*a*) is a schematic diagram showing the function and geometry of a prior art PLA. This PLA contains two programmable diode arrays (102,103). The first diode array (102) is called the "AND array" of the PLA because its function is to execute logic AND operations of its inputs. This AND array (102) contains (J+1) pairs of input lines (I0, I0#, I1, I1#, . . . , Ij, Ij#, . . . , IJ, IJ#), and (K+1) output lines (A0, A1, . . . , Ak, . . . , AK), where j, J, k and K are integers. Diodes (100) are selectively connected between the AND array input lines and the AND array output lines to control its logic functions. For the example in FIG. 1(*a*), A0 is connected to I0, I1#, and IJ# through diodes. If any one of the connected signals (I0, I1#, IJ#) are low, A0 will be low. On the other word, A0=I0*I1#*IJ#, where "*" represents logic AND operation. For another example, Ak is connected to I1 and IJ# through diodes so that Ak=[I1*IJ#], . . . etc.

The second diode array (103) of the PLA is called the "OR array" because its function is to execute logic OR operations. This OR array comprises (K+1) input lines (A0', A1', . . . , Ak', . . . , AK'), and (M+1) output lines (R0, R1 . . . , Rm, . . . , RM), where k, K, m and M are integers. Diodes (109) are selectively connected between the OR array input lines and the OR array output lines to control its logic functions. For the example in FIG. 1(*a*), R0 is connected to A0', A1', and Ak' through diodes. If any one of the connected signals (A0', A1', Ak') are high, R0 will be high. On the other word, R0=[A0'+A1'+Ak'], where "+" represents logic OR operation. RM is connected to A1', Ak' and AK' through diodes so that RM=[A1'+Ak'+AK'], . . . etc. The horizontal lines of the AND array and OR array represent intermediate logic terms called "minterms" in the art.

This PLA has (J+1) external input signals (IN1, IN2, . . . , INj, . . . , INJ), where j and J are integers. Each input signal is connected to one PLA input circuitry (105). Details of the PLA input circuitry (105) are shown in FIG. 1(*b*). For the example, the j'th PLA input signal (INj) is connected to an inverter (121) to generate an inverted signal INj# that is connected to the gate of an n-channel transistor (MN1). The source of MN1 is connected to the drain of another n-channel transistor (MN3). The drain of MN1 is connected to one PLA AND array input signal (Ij), that is also connected to the drain of a p-channel transistor (MP1). The source of MP1 is connected to power supply voltage Vcc. The gate of MP1 is connected to pre-charge signal PG#, that is also connected to the gate of MN3. The source of MN3 is connected to ground. The signal INj# is inverted by an inverter (122) before it is connected to the gate of an n-channel transistor (MN2). The source of MN2 is connected to the drain of another n-channel transistor (MN4). The drain of MN2 is connected to the other PLA AND array input signal (Ij#), that is also connected to the drain of a p-channel transistor (MP2). The source of MP2 is connected to Vcc, while the gate of MP2 is connected to the pre-charge signal PG#. The gate of MN4 is also connected to PG#. The source of MN4 is connected to Vss. When the PLA is idle, PG# is low, and both Ij and Ij# are pulled to power supply voltage Vcc. When the PLA is activated by pulling PG# high, Ij and Ij# are activated; if INj is high, Ij# is driven to ground voltage Vss while Ij is at high impedance state; if INj is low, Ij is driven to Vss while Ij# is at high impedance state. Referring back to FIG. 1(*a*), paired input signals are connected to vertical input lines (I0, I0#, I1, I1#, . . . , Ij, Ij#, . . . , IJ, IJ#) of the AND array (102). These AND array input lines intersect horizontal AND array output lines (A1, A2,...,Ak,...,AK).Atidlestate,thesehorizontallines(A1,A2,..., Ak, . . . , AK) of the AND array are pre-charged to Vcc using p-channel transistors (104) controlled by pre-charge signal PG#. The signal PG# is also connected to a delay circuit (108) to generate OR array pre-charge signals (PG, PG1#). FIG. 1(*c*) shows the structures of the delay circuit (108). A programmable delay circuitry (125) provides proper delay time, and the output of the delay circuit is connected to an inverter (126) to generate signal PG that is also connected to another inverter (127) to generate signal PG1#. These OR array pre-charge signals (PG, PG1#) control the data converters (107) between AND array and OR array. The structure of the data converter (107) is shown in FIG. 1(*d*). The k'th AND array output signal (Ak) is inverted by an inverter (123) before connected to the gate of a p-channel transistor (MP5). The source of MP5 is connected to PG1#, while its drain is connected to corresponding OR array input line (Ak'). Signal Ak' is also connected to the drain of an n-channel transistor (MN5). The gate of MN5 is connected to PG, while its source is connected to ground Vss. At idle state, PG1# is low and PG is high so that Ak' is always driven to Vss. When the OR array (103) is activated, PG is low and PG1# is high; Ak' is driven to Vcc if Ak is high, while it is at high impedance if Ak is low.

FIG. 1(*e*) illustrates the timing waveforms of critical signals for the PLA. Before time Tst, the PLA is at idle state; both PG# and PG1# are low; all the AND array input signals (Ij, Ij#, j=0, 1, . . . , J) and output signals (Ak, k=0, 1, . . . , K) are high; all the OR array input signals (Ak', k=0,1, . . . , K) and all the PLA output signals (Rm, m=0,1, . . . , M) are low. At time Tst, the AND arrays are activated by pulling PG# high, and some of the AND array output signals (Ak, k=0,1, . . . , K) are pulled low depending on the diode connections and the value of PLA input signals. At time Tr in FIG. 1(*e*), PG1# is pulled high to activate the PLA OR arrays, and the values of the AND array outputs (Ak) propagate to the OR array to generate PLA outputs (Rm). The PLA outputs (Rm) are ready at time Td in FIG. 1(*e*). To terminate the PLA operation, PG# is pull down at time Trst, and all the signals return to their idle states at time Te as shown in FIG. 1(*e*).

The above example uses diodes in the programmable arrays. There are many other types of prior art PLA's. For example, many prior art PLA's use n-channel metal-oxide-semiconductor (MOS) transistors in the programmable array. The AND-OR arrays can be replaced by NOR-NAND arrays or other types of logic combinations. All of those prior art PLA's follow similar operational principles, and they have the same problems that can be solved by the same solutions of the present invention. We will not describe other prior art PLA's in further details.

For simplicity, we only reveal small parts of the programmable connections in the AND arrays and OR arrays in FIG. 1(*a*). In reality, a PLA usually have hundreds of minterms. FIG. 1(*f*) shows a symbolic representation used by the present inventor to show the connections in large programmable arrays. Each vertical line in the AND array (161) represents a pair of input lines. Each horizontal line in the AND array (161) represents one output line. An open dot (164) at the intersection between an input line and an output line of the AND array (161) represents a programmable connection between a positive input line and an output line at the intersection. A solid dot (163) at the intersection between an input line and an output line of the AND array (161) represents a programmable connection between a negative input line and an output line at the intersection. Each horizontal line in the OR array (162) represents an OR array input line. Each vertical line in the OR array (162) represents one output line of the OR array. An open dot (165) at the intersection between an input line and an output line of the OR array (162) represents a programmable connection. The peripheral circuits are not shown in details in this symbolic diagram. The symbolic diagram in FIG. 1(*f*) allows us to show the connections of large PLA with simple diagrams. We will use similar symbolic diagrams in the following discussions.

PLA circuits usually use smaller areas than combination logic circuits of the same functions. The regular structures of PLA also make it much easier to make modifications. Timing and speed of PLA circuits are much easier to control, especially for advanced IC technologies. Power consumption is its major disadvantage. The above example in FIGS. 1(*a–f*) illustrates the reasons why prior art PLA's consume more power than gate array logic circuits. Gate array logic circuits break down complex logic calculations into single step logic operations, and implement those logic operations by series of logic gates. During a logic calculation, only those gates change their outputs would consume power. For most of cases, only a small part of the gates in a large GA logic circuitry consume power. A PLA combines all the logic relations between a large number of input signals and output signals into programmable logic arrays with hundreds of minterms. A PLA always consumes power whenever it is activated. Even for the simplest logic operations the PLA will consume maximum power as if all the inputs and outputs are involved. Therefore, PLA's usually consume much more power than equivalent GA circuits.

Engeler et al. in U.S. Pat. No. 4,782,249 provided a method to reduce PLA power consumption by designing PLA using CMOS static circuits. A static PLA consumes no power when all the PLA inputs are not changed. However, the static PLA still consumes a lot of power because each PLA signal is connected to a large loading. The static PLA also occupies much larger area than conventional PLA. The invention provides partial solution to the power consumption problem, but the major sources of the problem are not solved.

SUMMARY OF THE INVENTION

The primary objective of this invention is, therefore, to providing practical methods to reduce power consumed by PLA circuits. Another objective of this invention is to improve the performance of PLA. The other objective of the present invention is to provide power saving and performance improvement without increasing area and cost of PLA. Another primary objective of the present invention is to provide the capability to maximize the performance of logic circuits using advanced IC fabrication technologies.

These and other objectives are accomplished by novel PLA optimization methods. A large PLA is partitioned into smaller sub-PLA's. Minterms with shared logic terms are grouped together into the same partitions. Each individual PLA sub-array is activated only when its operation is required. There will be no power consumption whenever a sub-array won't influence the final outputs. A PLA of the present invention has the regular structures of prior art PLA's, while it has the power consumption characteristics of current art GA logic circuits. The power consumption of the resulting PLA is as low as equivalent GA logic circuits. For most cases, PLA's of the present invention occupy smaller areas than prior art PLA's. The performance is also improved.

While the novel features of the invention are set forth with particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 1(*b*) is the schematic diagram for the input circuitry of the PLA in FIG. 1(*a*);

FIG. 1(*c*) is the schematic diagram for the timing control circuit of the PLA in FIG. 1(*a*);

FIG. 1(*d*) is the schematic diagram for the minterm sensor of the PLA in FIG. 1(*a*);

FIG. 1(*e*) shows the timing relationships between critical signals of the PLA in FIG. 1(*a*);

FIG. 1(*f*) illustrates the PLA symbolic representations used by the present inventor;

FIG. 2(*b*) is the flowchart for the sorting methods in FIG. 2(*a*);

FIG. 2(*c*) is the flowchart for the partitioning methods in FIG. 2(*a*);

FIG. 2(*d*) is the flowchart for the physical design methods in FIG. 2(*a*);

FIG. 3(*b*) illustrates the PLA array connections after partitioning procedures have been done on the PLA array in FIG. 3(*a*);

FIG. 3(*c*) illustrates the PLA sub-array structures after the PLA in FIG. 3(*b*) have been divided into sub-arrays;

FIG. 3(*d*) is the schematic diagram for the output circuits of the PLA in FIG. 3(*c*);

FIG. 3(*e*) is the block diagram for the PLA activity control logic of the first sub-PLA in FIG. 3(*c*);

FIG. 3(*f*) is the schematic diagram for the shared minterm logic circuitry of the sub-PLA input circuits in FIG. 3(*e*);

FIG. 3(*g*) is the schematic diagram for the comparator circuitry of the PLA input circuits in FIG. 3(*e*);

FIG. 3(*h*) shows the timing relationships between critical control signals for the PLA in FIG. 3(*c*)

DETAILED DESCRIPTION OF THE INVENTION

Figure 1A:
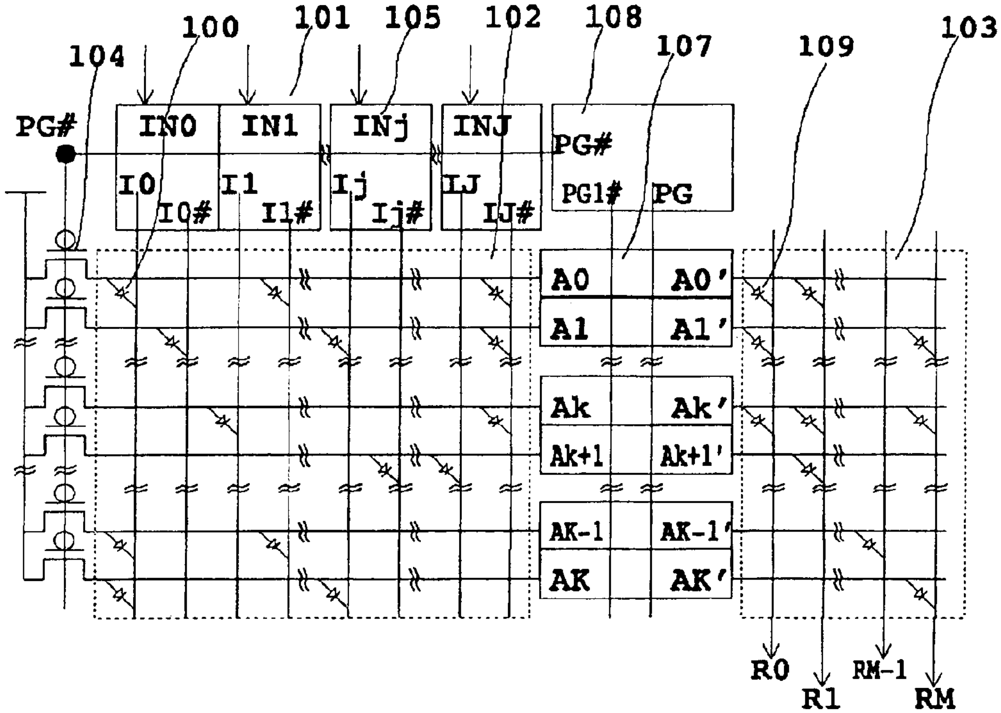
FIG. 1(*a*) is the schematic diagram for a prior art PLA.
Figure 1B:
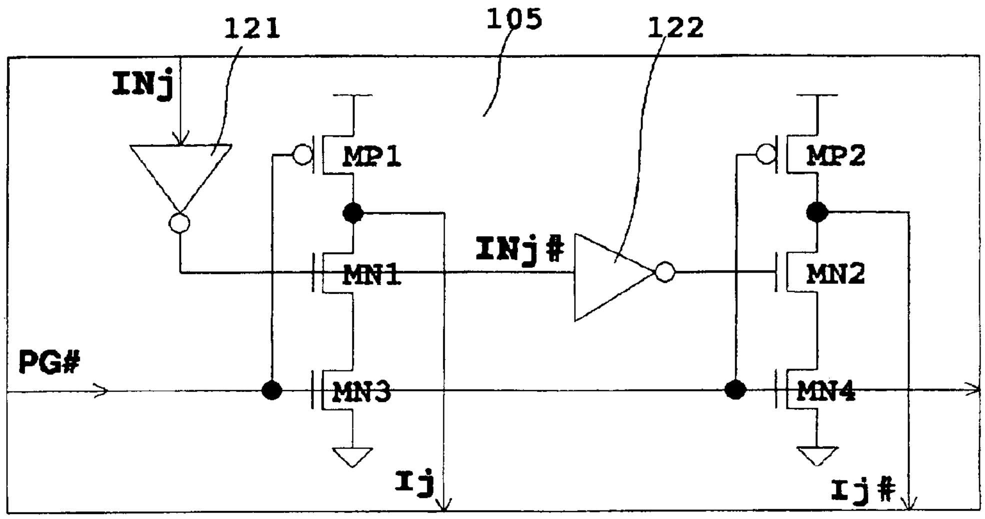
Figure 1C:
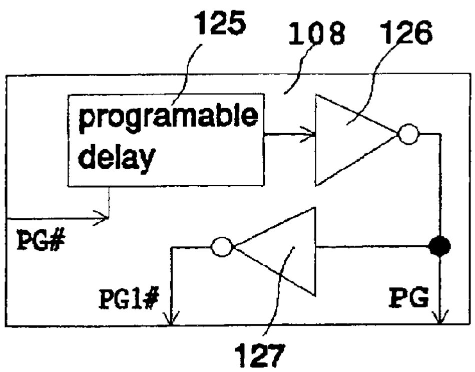
Figure 1C:
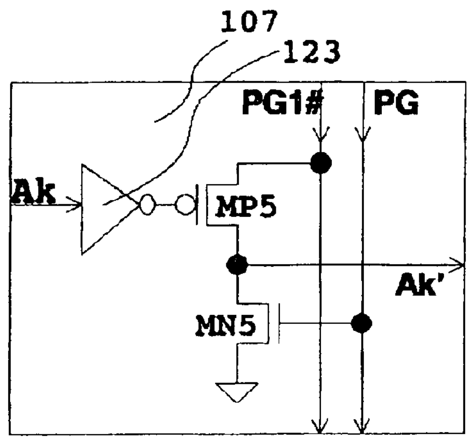
Figure 1E:
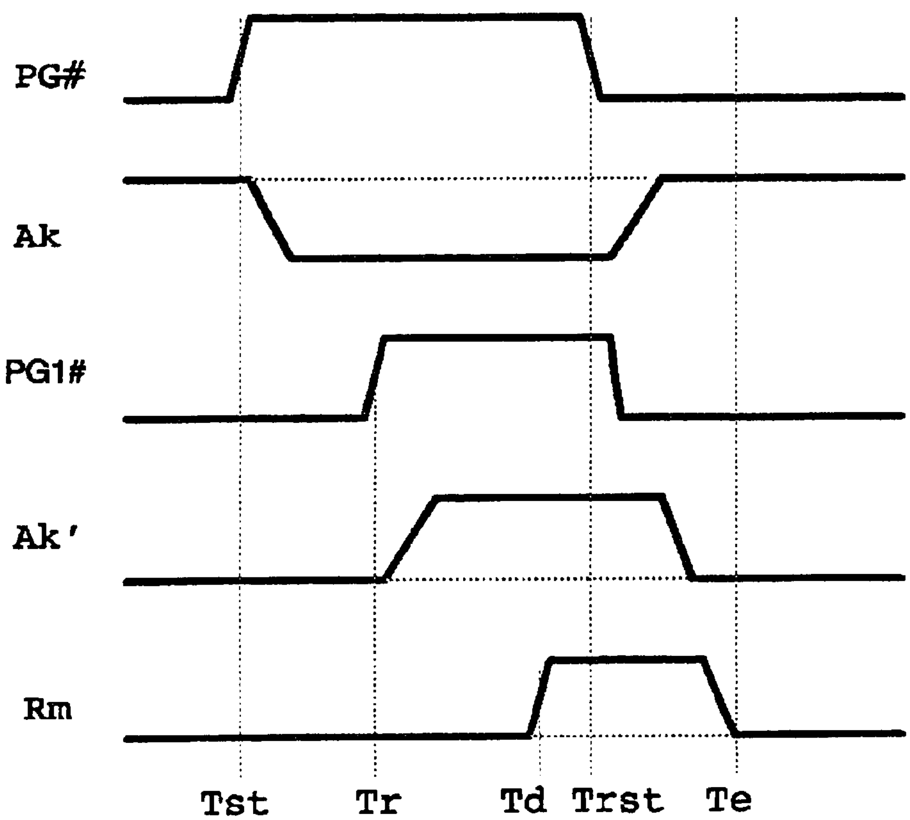
Figure 1F:
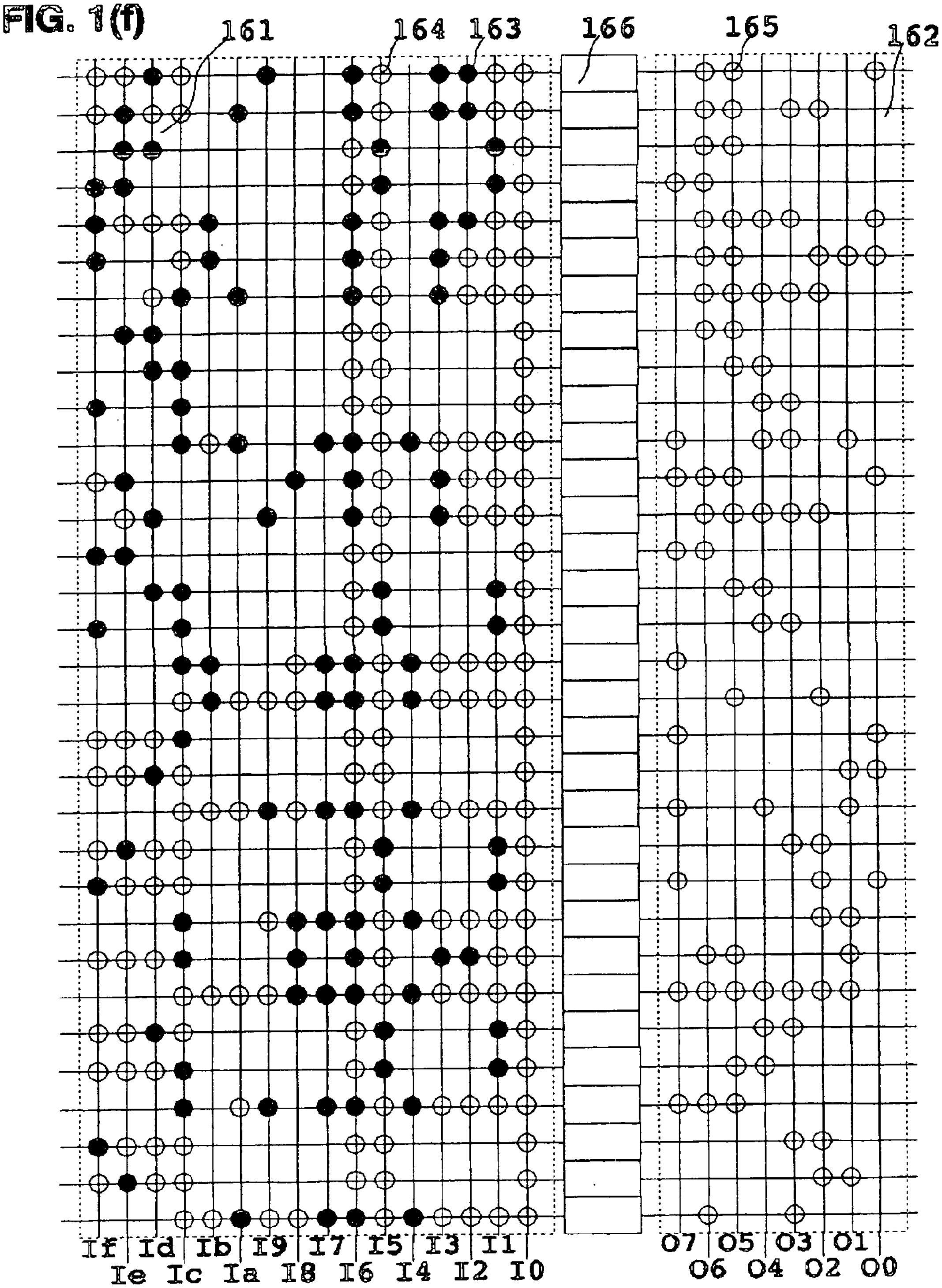
Figure 2A:
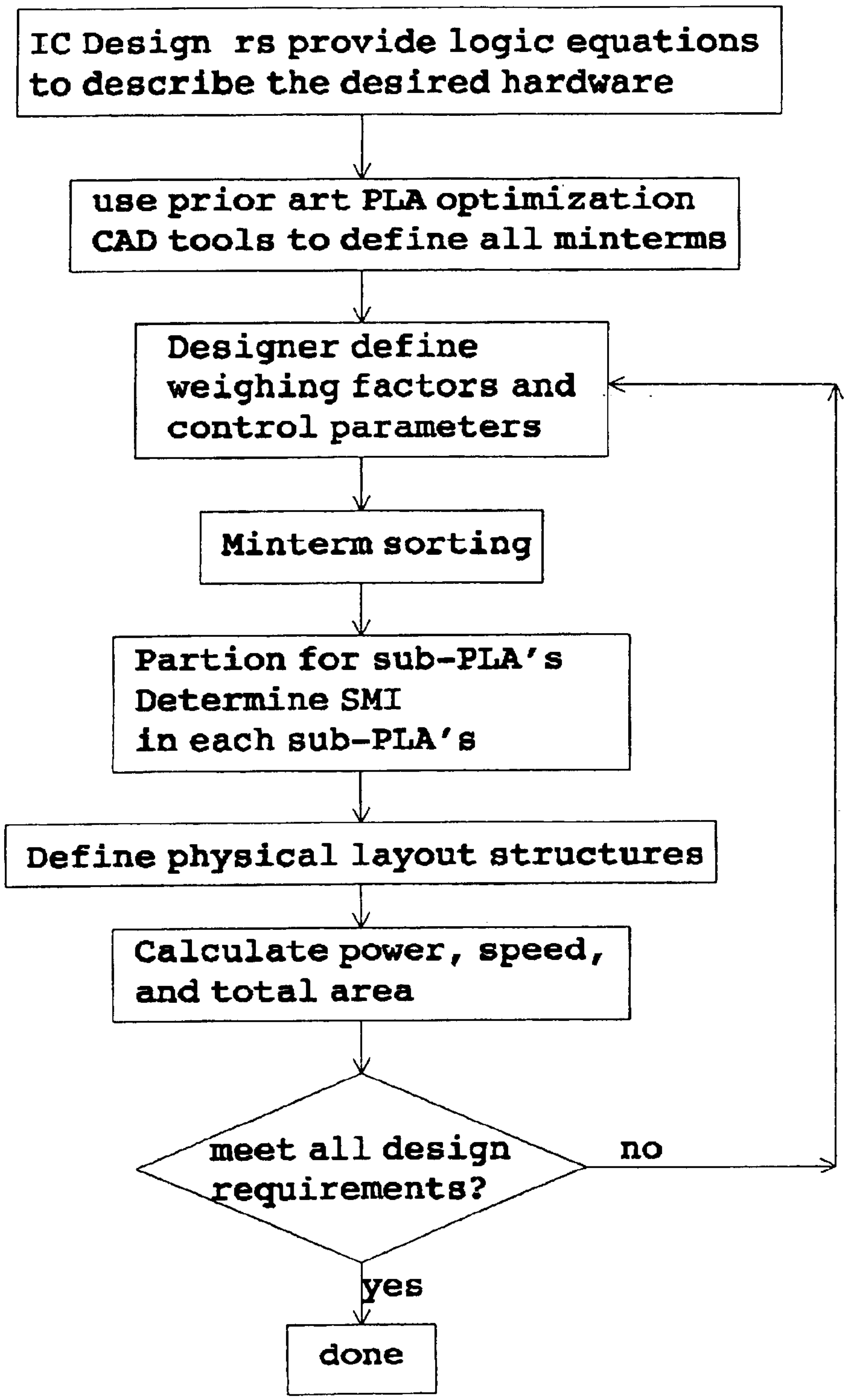
FIG. 2(*a*) is the flowchart for the PLA design methods of the present invention.
Figure 2B:
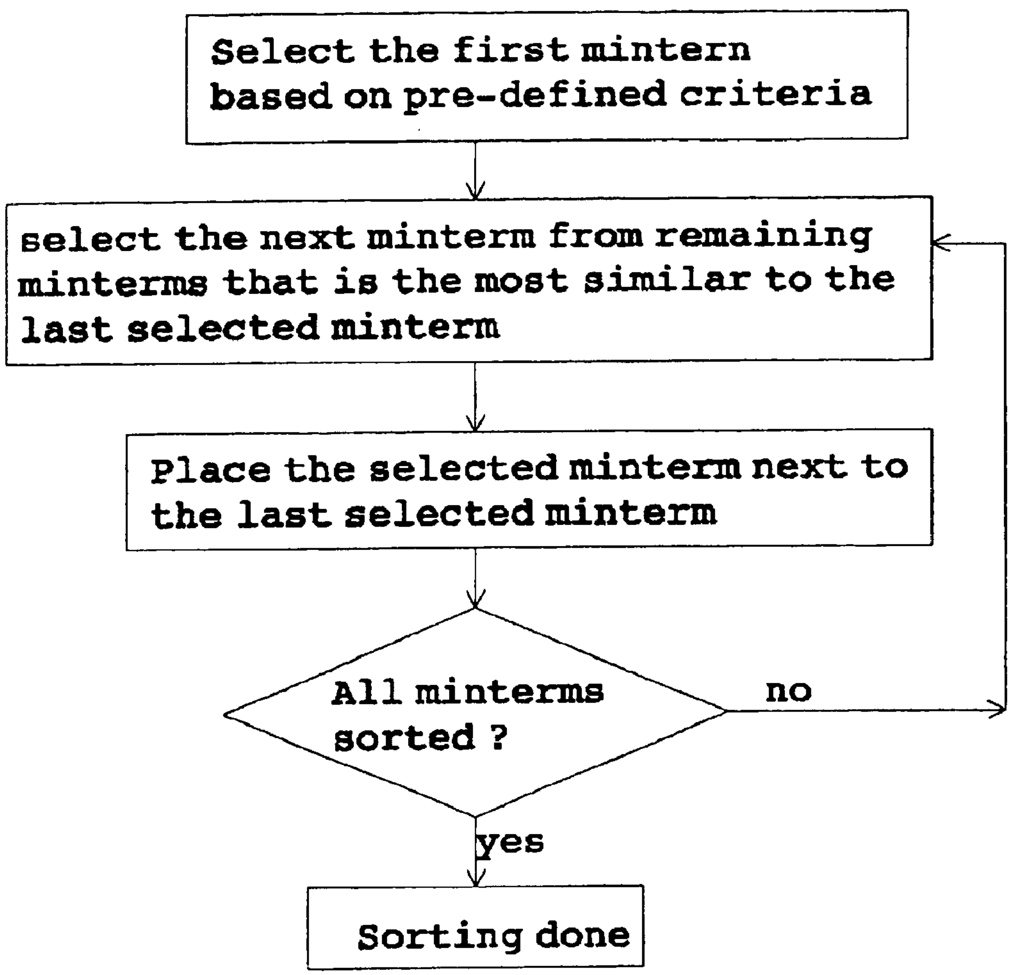
Figure 2C:
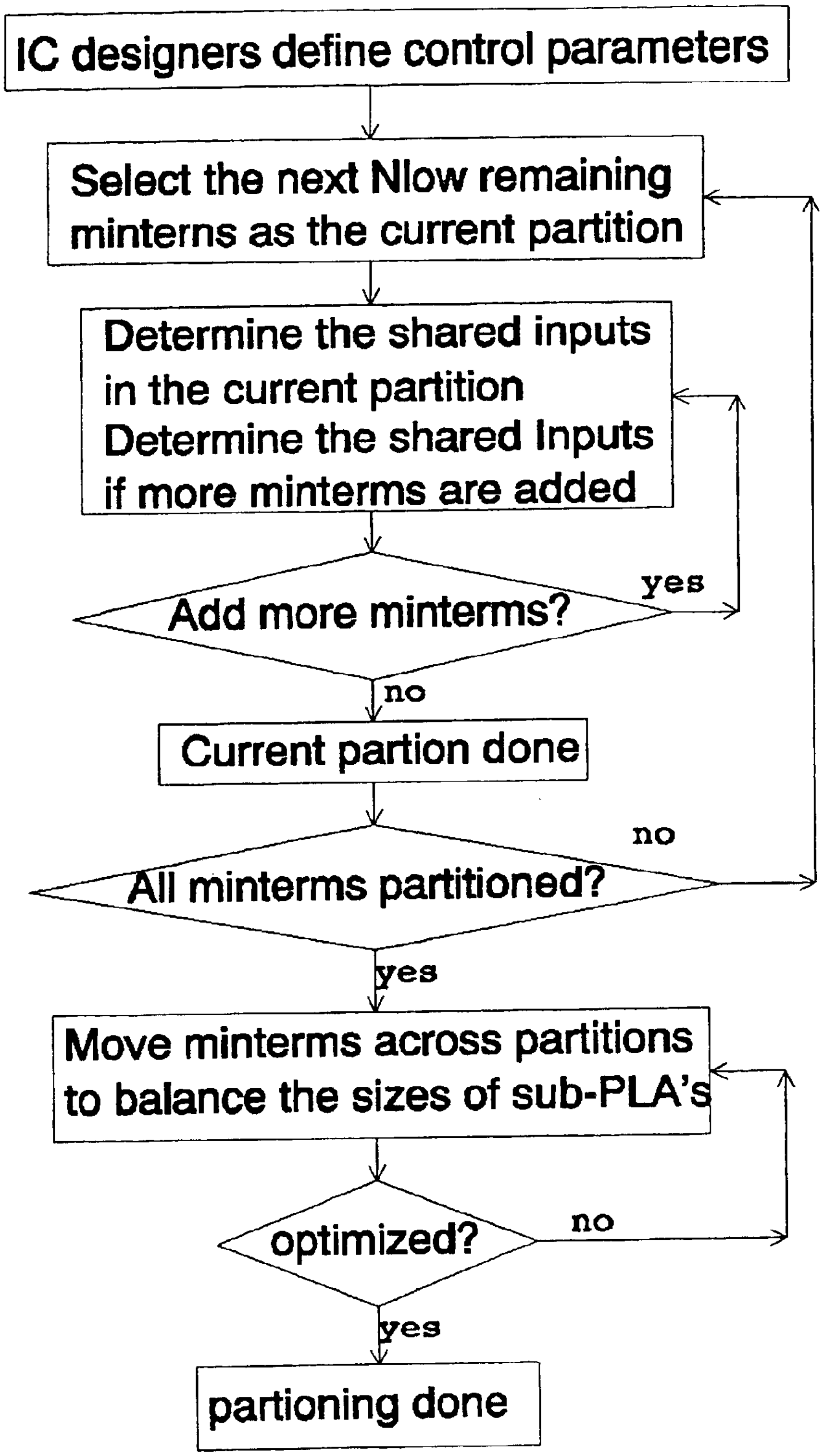
Figure 2D:
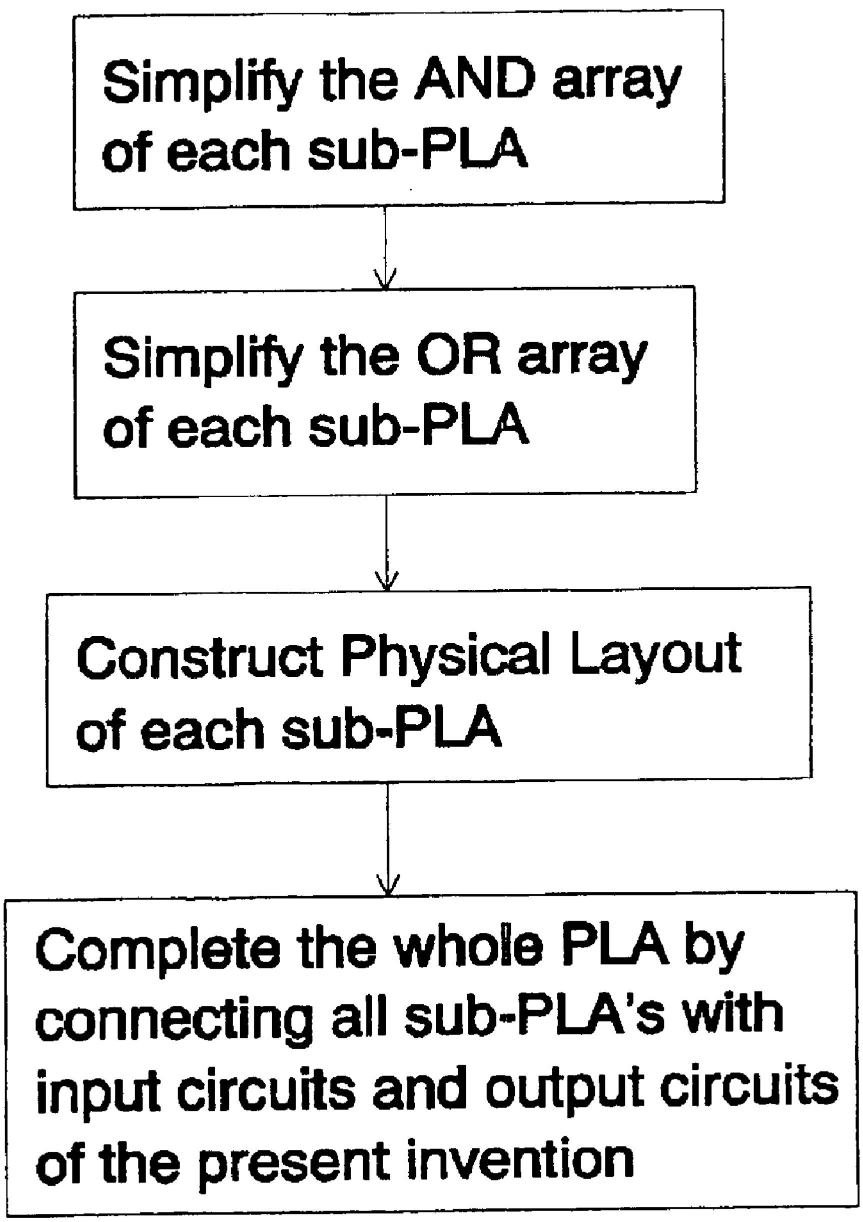
Figure 3A:
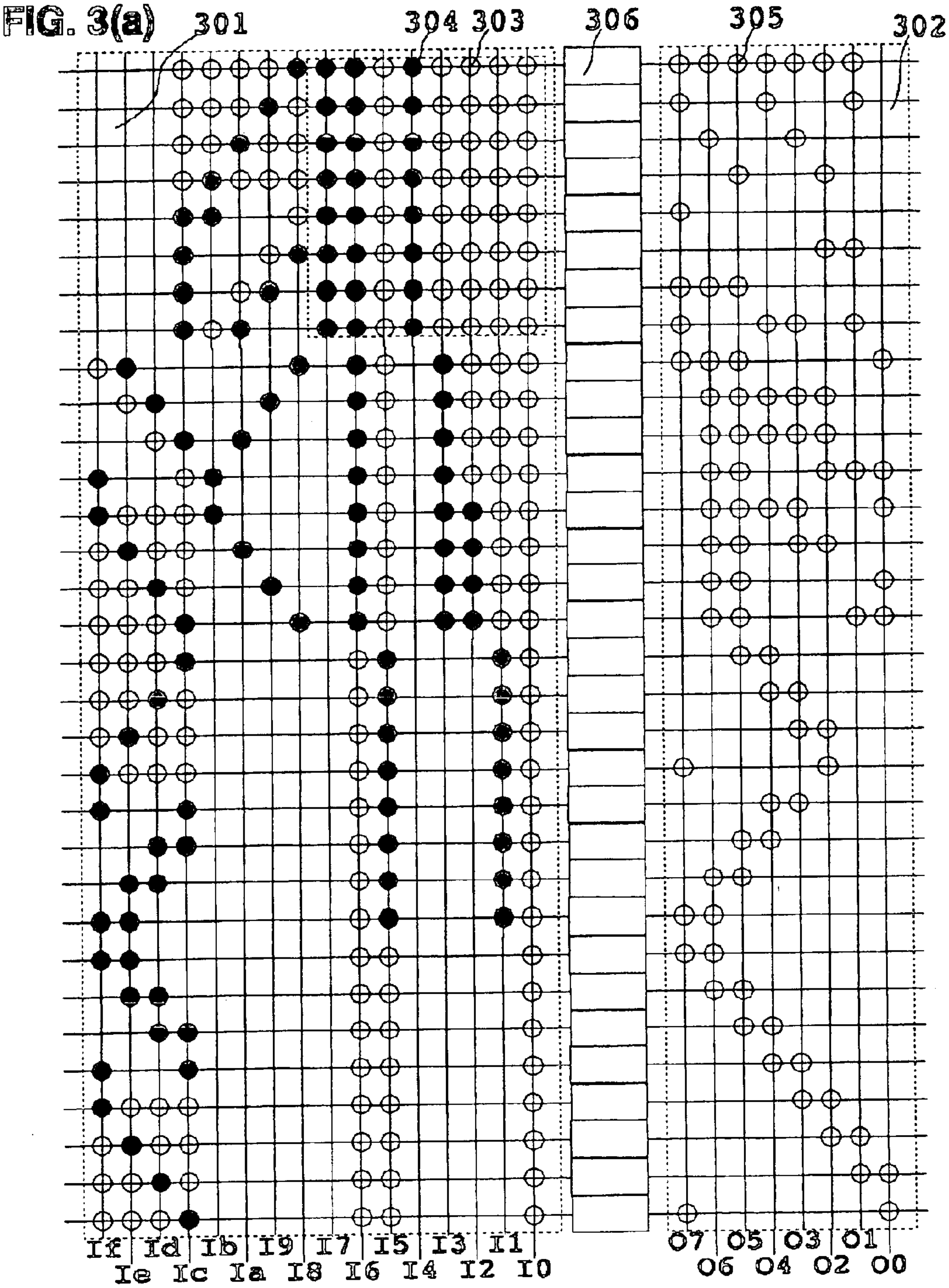
FIG. 3(*a*) illustrates the PLA array connections after sorting procedures have been done on the PLA array in FIG. 1(*f*)
Figure 3B:
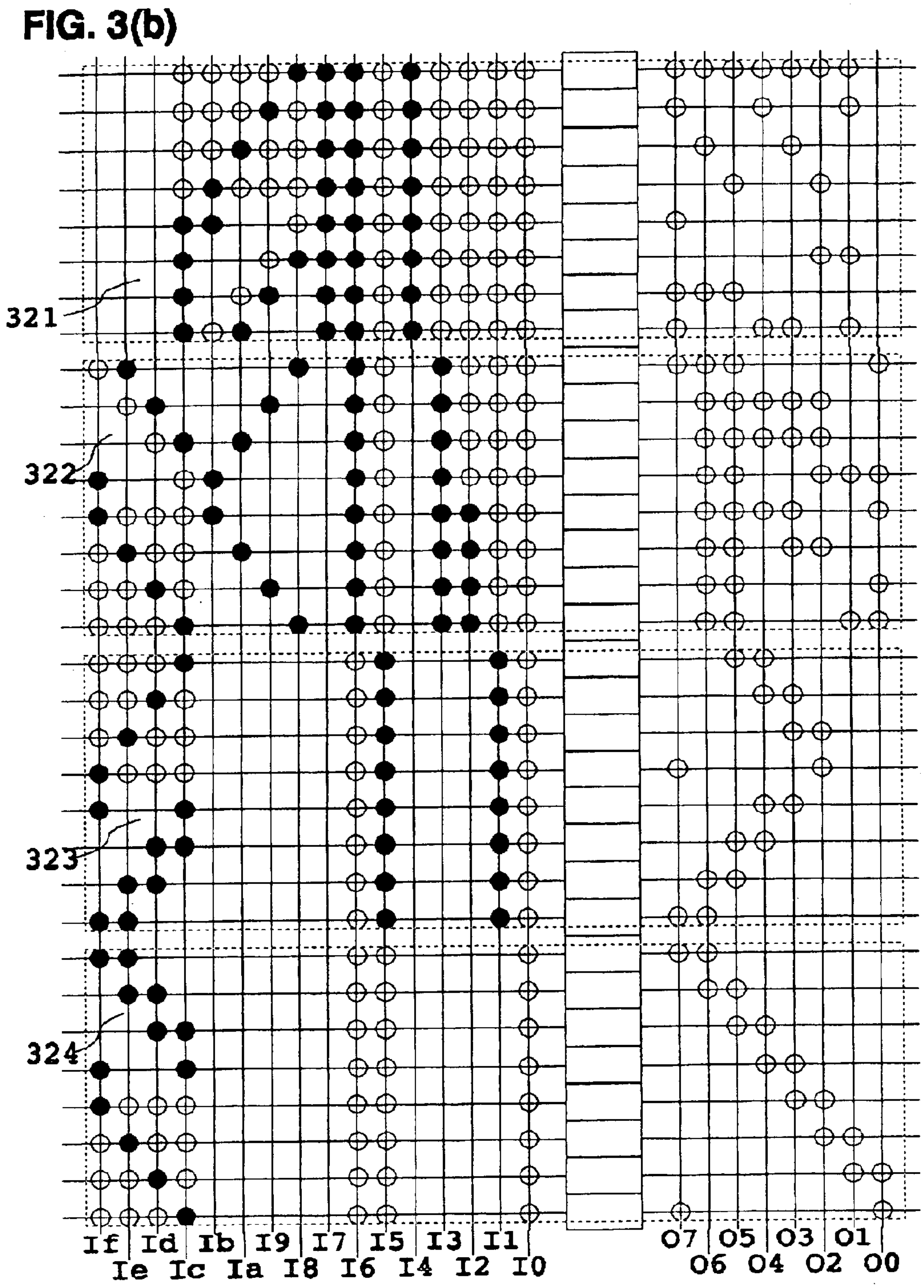
Figure 3C:
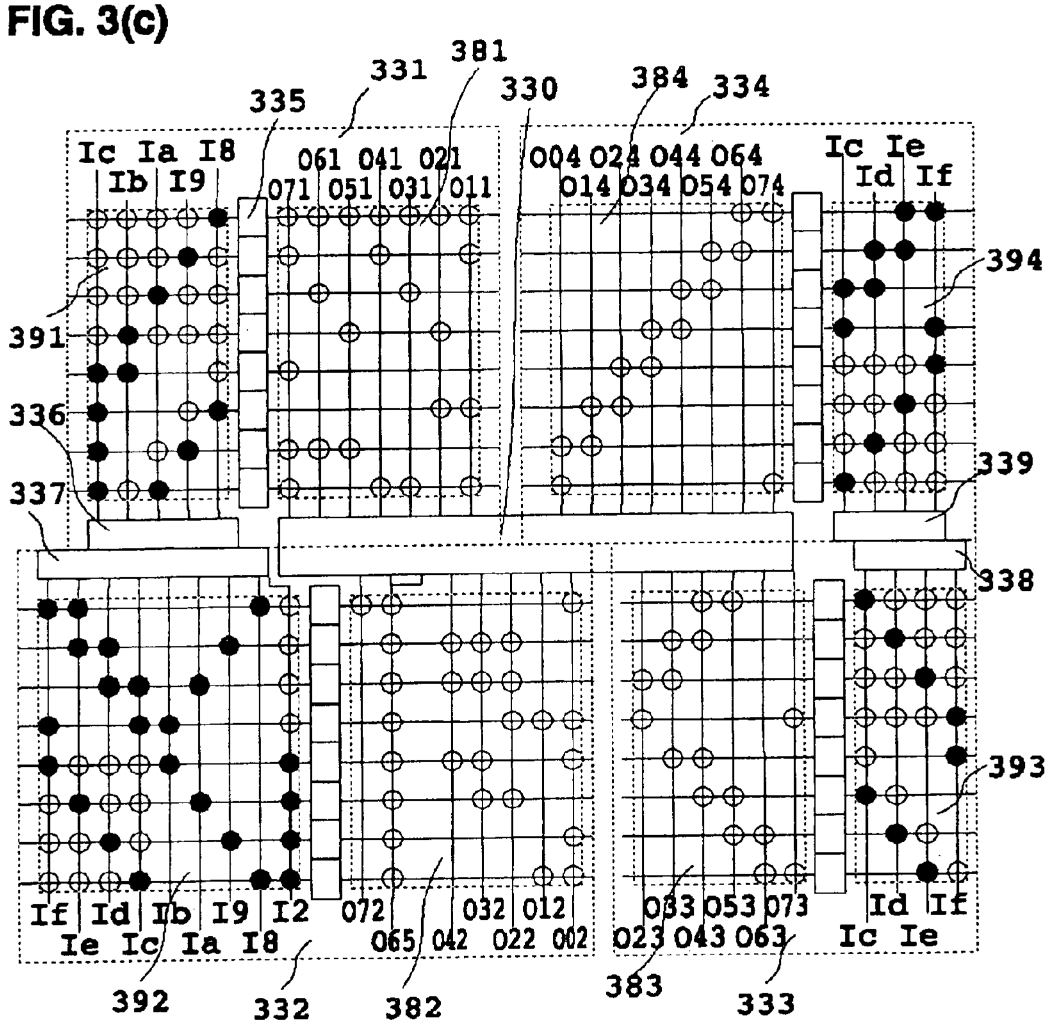
Figure 3D:
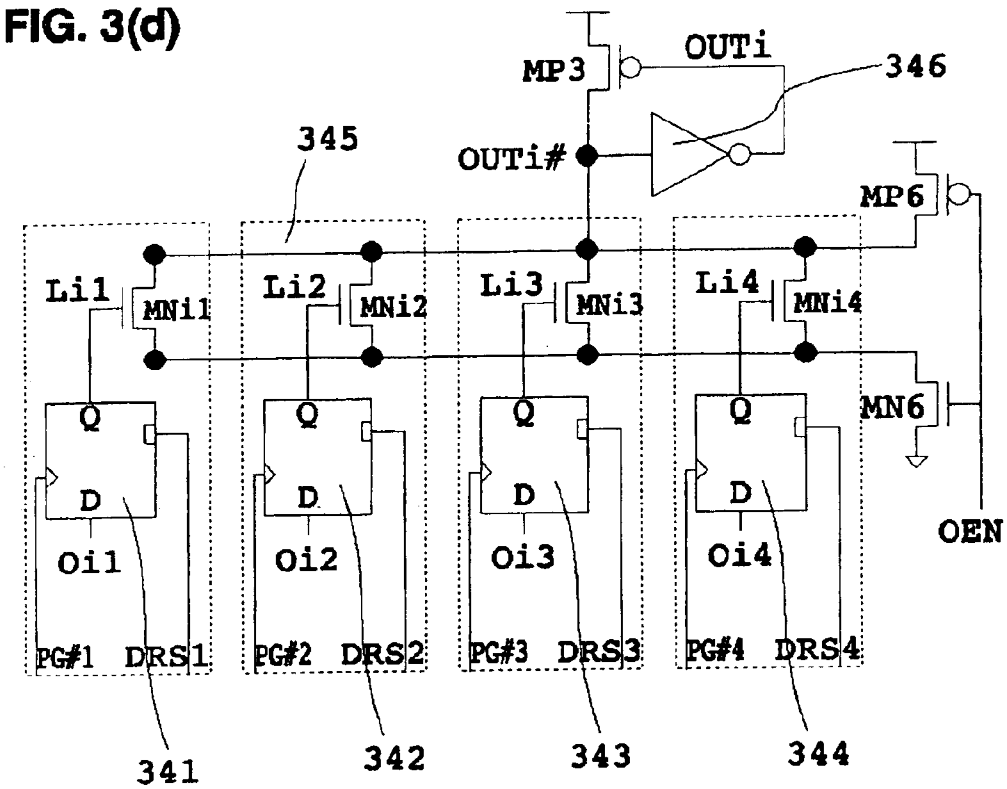
Figure 3E:
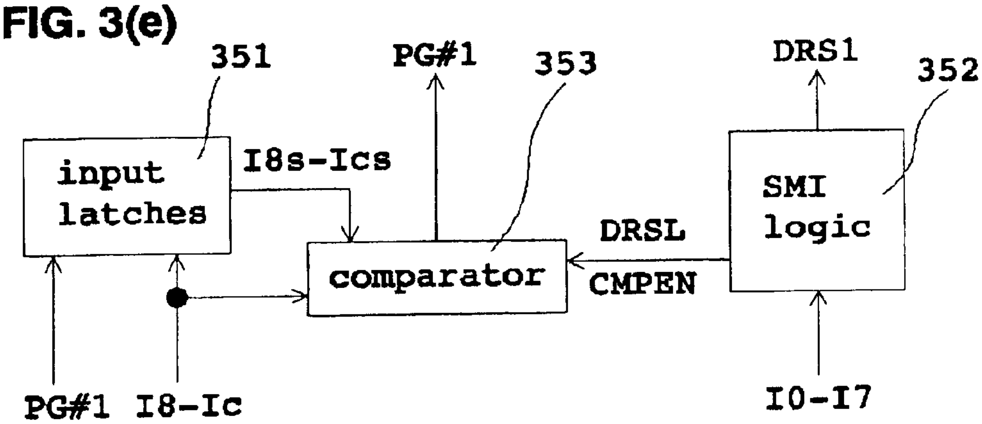
Figure 3F:
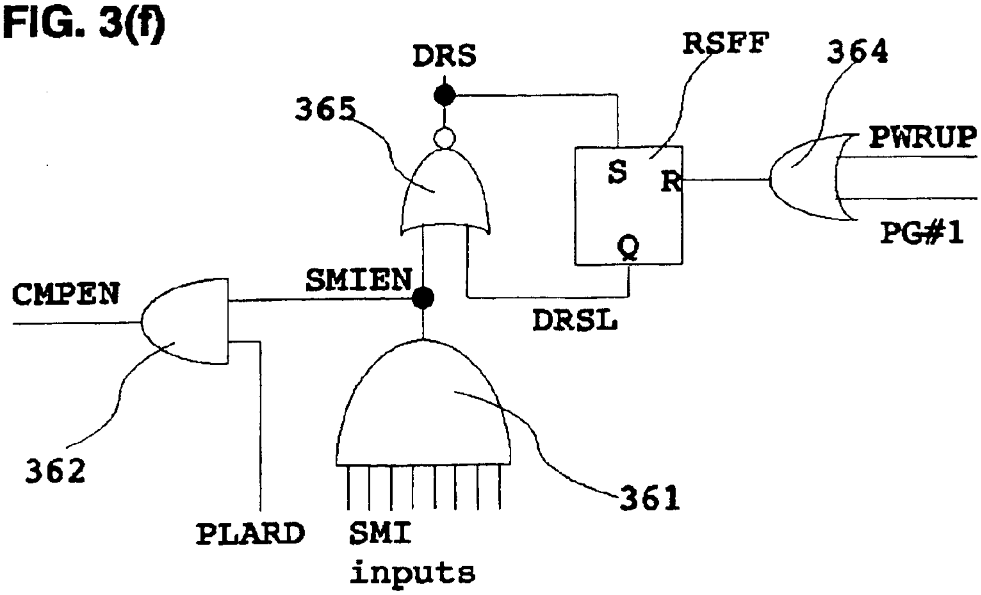
Figure 3G:
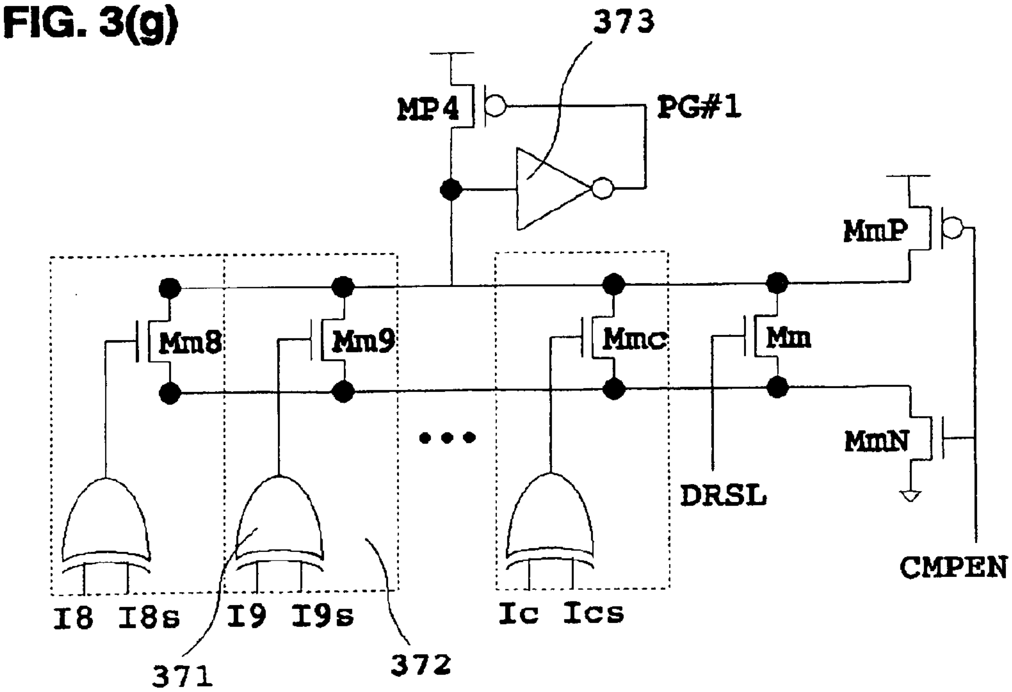
Figure 3H:
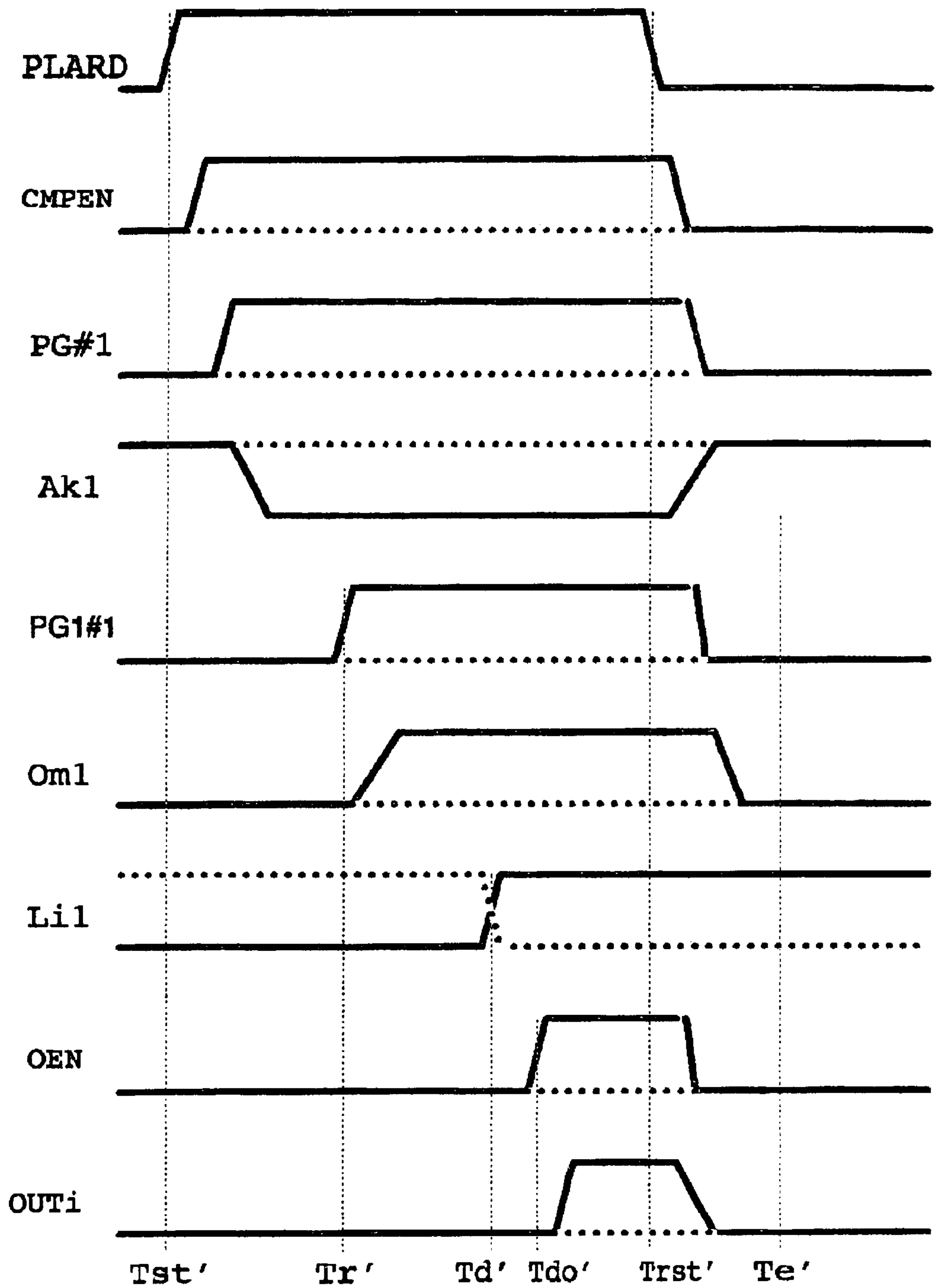

The PLA design methods of the present invention is demonstrated by a specific example starting from the PLA in FIG. 1(*f*). As illustrated by the flowchart in FIG. 2(*a*), the PLA design methods of the present invention comprise the following steps:

Step 1: IC designers provide logic equations for the desired hardware using hardware description languages (HDL). This design procedure is well known to the art of IC design.

Step 2: IC designers use prior art PLA optimization CAD tools to define the connections of the PLA according to the HDL defined in Step 1. Those prior art CAD tools can convert any combination logic equations into PLA hardware, and minimize the required number of minterms. The symbolic diagram in FIG. 1(*f*) illustrates one example of the resulting PLA connections. The logic relationships between input signals (I0, I1, . . . , If) and output signals (O0, O1, . . . , O7) are defined by the connections (163, 164) in one AND array (161) and the connections (165) in one OR array (162). For example, the output signal O2 in FIG. 1(*f*) is related to the input signals according to the connections in AND array and OR array as $$\begin{aligned} O2 = {} & I0*I5*I6*Ic*Id*Ie\#*If + I0*I5*I6*Ic*Id*Ie*If\# + \\ & I0*I1*I2*I3*I4\#*I5*I6\#*I7\#*I8\#*I9*Ia*Ib*Ic + \\ & I0*I1*I2*I3*I4\#*I5*I6\#*I7\#*I8\#*I9*Ic\# + \\ & I0*I1\#*I5\#*I6*Ic*Id*Ie*If\# + \\ & I0*I1\#*I5\#*I6*Ic*Id*Ie\#*If + \\ & I0*I1*I2*I3*I4\#*I5*I6\#*I7\#*I8*I9*Ia*Ib\#*Ic + \\ & I0*I1*I2*I3\#*I5*I6\#*I9\#*Id\#*Ie + \\ & I0*I1*I2*I3\#*I5*I6\#*Ia\#*Ic\#*Id + \\ & I0*I1*I2*I3\#*I5*I6\#*Ib\#*Ic\#*Id + \\ & I0*I1*I2\#*I3\#*I5*I6\#*Ia\#*Ic*Id*Ie\#*If \end{aligned} \quad (1)$$

where "*" represents logic AND operation, "+" represents logic OR operation, and "#" behind a signal represents inverted logic value of the signal. Logic equations for all the other outputs are also defined similarly in FIG. 1(*f*). The procedures in Steps (1–2) are well known in current art IC design. For a prior art PLA, the designers need to choose the inputs and outputs of a PLA properly in order to have efficient results. For a PLA of the present invention, the novel procedures of the present invention starting from step 3 will automatically optimize the resulting PLA circuits so that the IC designers do not need to worry about selections of input/output signals. At the initial steps IC designers should include as many input/output signals needed for desired logic operations as possible.

Step 3: IC designers define weighing factors and other control parameters for CAD tools of the present invention. Default values can be used before proper values for those control parameters have been calibrated. The weighing factors allow IC designers to define different levels of "importance" on each PLA input/output signals. For example, we can assign large weighing factors to the most frequently used input signals, and assign small weighing factors to seldom used input signals. The effects of those control parameters will be explained in the following discussions.

Step 4: Start minterm sorting procedures using CAD tools of the present invention. One example of the sorting procedures is shown by the flowchart in FIG. 2(*b*) that comprises the following procedures (S1–S4).

Procedure S1: Select the first minterm from the minterms defined in Step 2. This first minterm can be selected arbitrarily using any criteria. In our example, we select the minterm with the largest complexity factor as the first minterm. The complexity factor (CF) is defined as $$CF = \Sigma Wj \quad (2)$$

Where Σ represents summation over all PLA inputs connected to the minterm, Wj is the weighing factor for the j'th input/output signal that is connected to the minterm. In our example, the top minterm in FIG. 3(*a*) is selected from the minterms in FIG. 1(*f*) as the first minterm based on its complexity factor.

Procedure S2: Select the next minterm from the remaining minterms that is the most similar to the last selected minterm. There are many possible methods for this selection procedure. One method is to define a similarity factor (SF) as $$SF = \Sigma[\text{Same\_Connection}(Ij)*Wj] \quad (3)$$

where Same_Connection(Ij) is a function that returns 1 when the current minterm and the last selected minterm have the same connection to the j'th PLA input (Ij), and it returns 0 otherwise. The minterm with the highest SF value is defined as "the most similar" minterm to the last selected minterm. In this example, we assume the weighing factor (Wj) used to define SF is the same weighing factor used to define CF. However, these weighing factors can be defined separately for better optimization results.

Procedure S3: Place the most similar minterm selected by the above procedure next to the last selected minterm.

Procedure S4: Define the minterm selected by Procedure S3 as the new "last selected minterm", and go back to Procedure S2 until all the minterms in the PLA are sorted. These procedures are illustrated by the flowchart in FIG. 2(*b*).

FIG. 3(*a*) shows the symbolic diagram of a PLA after the minterm sorting procedures have been finished. The PLA in FIG. 3(*a*) has identical logic functions as the PLA in FIG. 1(*f*) except that its minterms have been sorted according to the above procedures.

While specific embodiments of the invention have been illustrated and described herein, it is realized that other modifications and changes will occur to those skilled in the art. There are many other methods for sorting the PLA minterms. One example is to sort according to similarity in PLA output signals instead of input signals. Another example is to sort according to both output and input signals. One may choose not to do any sorting at all. It should be understood that the above particular examples are for demonstration only and are not intended as limitation on the present invention.

Step 5: Partition the PLA sorted by Step 4 into a plurality of sub-PLA's, and determine shared minterm inputs in each sub-PLA. One example of the partitioning procedures is shown by the flowchart in FIG. 2(*c*) that comprises the following procedures (P1–P5).

Procedure P1: IC designers define control parameters Nlow, Nhigh, and weighing factors for each PLA input/output signals. The control parameter Nlow represents the smallest number of minterms allowed for each sub-PLA.

The parameter Nhigh represents the largest number of minterms allowed for each sub-PLA. These control parameters are defined by designers based on practical design limitations. A sub-PLA with very small minterm number is not practical. It would be more efficient to use logic gates to execute the function of such small sub-PLA. It is therefore necessary to have a control parameter Nlow limiting the minimum number of minterms in a sub-PLA. A sub-PLA with very large minterm number will have poor performance. It is therefore necessary to have a control parameter Nhigh. For layout simplicity, it is beneficial to have sub-PLA's of similar sizes. Layout simplicity is therefore another factor to define Nlow and Nhigh. Other control parameters are also defined in this stage.

Procedure P2: Select the next Nlow minterms from the remaining sorted PLA minterms as initial partition group for a sub-PLA.

Procedure P3: Determine if the minterms in the sub-PLA under partitioning have identical connections to a sub-set of the PLA inputs. In the following discussions, we call those input signals that have identical connections to all the minterms in a sub-PLA as the "shared minterm inputs" (SMI). The logic operation for those SMI is called "shared minterm logic" (SML). For example, the SMI for the first 8 minterms of the PLA in FIG. 3(*a*) are (I0–I7) while the SML for those 8 minterms is (**I0*I1*I2*I3*I4#*I5*I6#*I7#). For another example, the SMI fore the first 16 minterms of the PLA are (I0, I1, I5, I6) and their SML is (I0*I1*I5*I6#**).

Procedure P4: Determine whether it is beneficial to add more minterms to the current partition group. If the minterm number is already at the maximum allowed number Nhigh, the answer is obviously no. If adding additional minterms do not change the SMI of current partition group, it is most likely beneficial to add those minterms to the group. If adding additional minterms will reduce the number of shared minterm inputs, then we need to justify the changes. In our example, we define a partition factor (PF) as $$PF=\Sigma(WPm)+WPs*(Np-Nlow)^{Pexp} \quad (4)$$

Where Σ represents summation over all SMI signals, WPm is the partition weighing factor for the m'th SMI signal of the current partition group, Np is the total number of minterms in the current partition group, Pexp is a the exponential weighing factor for sub-PLA size, and WPs the size linear weighing factor. The first term Σ (WPm) tends to reduce the number of minterms in the sub-PLA under partitioning, while the second term $WPs*(Np-Nlow)^{Pexp}$ tends to increase the number of minterms. In our example, we add more minterms to current partition group until PF reaches its maximum value or until minterm number reaches Nhigh, then go back to Procedure P2 to partition for next sub-PLA. After all the minterms in a PLA have been partitioned into sub-PLA's, we move to Procedure P5 as illustrated by the flowchart in FIG. 2(*c*).

Procedure P5: Move minterms across the partitions defined by previous procedures to balance the sizes of sub-PLA's. It is beneficial to balance the sizes of all sub-PLA's by moving minterms between nearby sub-PLA's. After the whole structure is optimized, the partition procedures are done, and we are ready to move to Step 6. For the example in FIG. 3(*a*), the above partition procedures (P1–P5) defines 4 sub-PLA partitions (321–324) as marked by dashed lines in the symbolic diagram in FIG. 3(*b*). Ideally, the SMI in each partition should contain as many inputs as possible, and the sizes of each sub-PLA should be as balanced as possible. The example in FIG. 3(*b*) is simplified for illustration purpose. For practical cases, the number of minterms in each sub-PLA partition is usually higher than that in our example.

While specific embodiments of the invention have been illustrated and described herein, it is realized that other modifications and changes will occur to those skilled in the art. It should be understood that the above particular examples are for demonstration only and are not intended as limitation on the present invention. There are many other methods applicable to partition a large PLA into sub-PLA's. One example is to optimized for the most "shared minterm output" (SMO) signals instead of SMI signals. The other example is to optimize for both input and output signals. A simple example is to partition into sub-PLA's of equal minterm numbers or a fixed minterm number. We can define many other control parameters other than Nlow and Nhigh. We also can add "dummy minterms" to each sub-PLA to balance the sizes of sub-PLA's. Those dummy minterms provide backup layout area in case we need to modify the logic functions of the PLA. Another partition method implemented by the present inventor is to divide a large PLA into integer multiples of 4 sub-PLA's. The output circuits from 4 sub-PLA's can be placed within close distance, which is strongly desirable if domino circuits are used.

Step 6: Determine the physical layout structures for all sub-PLA's defined in the above steps. One example of the procedures to define the layout for a PLA of the present invention is shown by the flowchart in FIG. 2(*d*) that comprises the following procedures (L1–L4).

Procedure L1: Simplify the AND array of each sub-PLA. In Step 5 we already partition a large PLA into smaller sub-PLA's. One major advantage for such partitioning is that the individual sub-PLA's usually can be simplified. Simplification is possible if the sub-PLA has SMI/SMO or unused input/output lines. For example, the first partition (321) in FIG. 3(*b*) has SMI comprising input signals from I0 to I7. The logic function (SML=I0*I1*I2*I3*I4#*I5*I6#*I7#) of all the AND array connections for those SMI signals can be replaced by one logic circuitry. In addition, three input signals (Id, Ie, If) are not used by the first partition (321) in FIG. 3(*b*). Therefore, we can simplify the first sub-PLA (331) by removing (a)all the SMI input lines (I0 to I7 in this example) and (b)all the unused input lines (Id, Ie, and If in this example). The resulting AND array (391) for the first sub-PLA (331) is shown in FIG. 3(*c*). For another example, the second partition (322) in FIG. 3(*b*) has SMI comprising input signals I0, I1, I3, I5, and I6 with SML=I0*I1*I3#*I4#*I5*I6#. Two input signals (I4, I7) are not used by this partition (322). The simplified AND array (392) for the second sub-PLA (332) is shown in FIG. 3(*c*). Using the same methods, the AND arrays (393,394) for the remaining sub-PLA's (333,334) also can be simplified as shown in FIG. 3(*c*).

Procedure L2: Simplify the OR array of each sub-PLA. The OR array of a sub-PLA can be simplified if it comprises SMO or unused output lines. The SMO of a partition can be replaced by a single output line. For example, the SMO for the second partition (322) in FIG. 3(*b*) are O5 and O6. They can be replaced as one output line (O65) in the OR array (382) of the second sub-PLA as shown in FIG. 3(*c*). This output line (O65) is connected to two corresponding inputs to the output circuits (330) of the PLA. For another example, the third partition (323) in FIG. 3(*b*) have two unused output lines (O1 and O0 in this example). The corresponding sub-PLA (333) OR array (383) shown in FIG. 3(*c*) does not need to have those two output lines.

The simplifications described in the above procedures are not possible if the PLA has not been divided into sub-PLA's. The simplified sub-PLA's usually occupy much smaller areas than their corresponding areas in a large PLA.

Procedure L3: Construct the physical layout structures of individual sub-PLA. The peripheral circuits (335) of individual sub-PLA are identical to prior art PLA's as the examples shown in FIGS. 1(*a*–*d*) except that their minterms have been simplified by Procedures L(1,2). The CAD tools used to define the physical layout structures of sub-PLA's are therefore similar to current art PLA CAD tools.

Procedure L4: Complete the PLA design by connecting all sub-PLA's with output circuits (330) of the present invention as shown in FIG. 3(*c*), and place PLA activity control circuits (336–339) to control each sub-PLA. These input/output circuits are described in further details in the following sections.

FIG. 3(*d*) is the schematic diagram for one element of the output circuits (330) in FIG. 3(*c*). Only the circuit to generate one PLA output signal is shown in FIG. 3(*c*). The same circuit to generate other PLA output signals are identical. The i'th output line (i=0, 1, . . . , 7 in our example) from the first sub-PLA (Oi1) is connected to the data input of a latch (341). This latch (341) opens when the pre-charge signal (PG#1) of the first sub-PLA (331) is high, and it closes when PC#1 is low. The output (Li1) of the latch (341) is connected to the gate of an n-channel MOS transistor (MNi1). This latched output signal (Li1) can be reset by a reset signal (DRS1) provided by the PLA activity control circuits (336) of the first sub-PLA (331). The i'th output line (Oi2) from the second sub-PLA (332) is connected to a latch (342). This latch (342) opens when the pre-charge signal (PG#2) of the second sub-PLA (332) is high, and it closes when PC#2 is low. The output (Li2) of the latch (342) is connected to the gate of an n-channel MOS transistor (MNi2). This latched output signal (Li2) can be reset by the reset signal (DRS2) provided by the PLA activity control circuits (337) of the second sub-PLA (332). Similarly, the output lines (Oi3, Oi4 in this example) from all the remaining sub-PLA's (333, 334) are connected to corresponding latches (343, 344) with corresponding clock signals (PG#3, PG#4) and reset signals (DRS3, DRS4). The outputs of those latches (Li3, Li4) are connected to the gates of corresponding n-channel MOS transistors (MNi3, MNi4). The sources of all those MOS transistors (MNi1–MNi4) are connected together to the drain of an n-channel MOS transistor (MN6) as shown in FIG. 3(*d*). The source of MN6 is connected to ground, and its gate is connected to PLA output enable signal (OEN). The drains of all those MOS transistors (MNi1–MNi4) are connected together to the drains of two p-channel MOS transistors (MP3, MP6) and the input of an inverter (346). The output of the inverter (OUTi) is connected to the gate of MP3. The source of MP3 is connected to power supply voltage Vcc. The source of MP6 is connected to Vcc, and its gate is connected to the PLA output enable signal (OEN). The circuit in FIG. 3(*d*) is a domino OR gate. Its output (OUTi) equals the logic OR results of all the latched input signals (Li1–Li4) when the enable signal (OEN) is high. The data output latches (341–344) allow individual sub-PLA's to store results of previous calculations for power saving purpose.

FIG. 3(*e*) is the block diagram for one example of the PLA activity control circuits (336–339) of the sub-PLA (331–334) in FIG. 3(*c*). The input signals (I8, I9, Ia, Ib, Ic for this example) of the first sub-PLA (331) are connected to input latches (351) controlled by the sub-PLA pre-charge signal PG#1. These input latches store the values of input signals at the end of an activated sub-PLA operation signaled by the falling edge of PG#1. Therefore, the outputs (I8s, I9s, Ias, Ibs, Ics in this example) of those latches are the input signals at the last activated sub-PLA operation. These latched input signals are sent to a comparator (353) to be compared with new input signals (I8–Ic in this example). The comparator (353) is activated by an SMI logic circuitry (352). FIG. 3(*f*) describes further details for the SMI logic circuitry (352). The SMI signals (I0–I7 for this example) for this sub-PLA (331) are sent to a domino logic gate (361) to calculate the SML for the sub-PLA. For this example, the logic gate (361) output is SMIEN=I0*I1*I2*I3*I4#*I5*I6#*I7#. The PLA read enable signal (PLARD) and SMIEN are connected to an AND gate (362) to generate the comparator enable signal (CMPEN) to enable the comparator (353) for this sub-PLA. The comparator (353) is therefore enabled only when SMIEN is high. The signal SMIEN is also connected to the input of a NOR gate (365). The output of the NOR gate (365) is the output latch reset signal (DRS1) of this sub-PLA (331), which is also connected to the set signal of a Set-Reset-Flip-Flop (RSFF). The RSFF is reset after power up (signaled by PWRUP) or after the sub-PLA is activated (signaled by PG#1). The output (DRSL) of the RSFF is connected to the NOR gate (365). The logic function of this SMI logic (352) is to reset all the output latches of the sub-PLA when the SMI logic equation is low, and to turn on the comparator when it is high. The RSFF prevent unnecessary reset after the output latches have been reset. The signal DRSL is also sent to the comparator because once an output reset was done, we need to activate the sub-PLA even when all the sub-PLA input signals match with previous input signals.

FIG. 3(*g*) is the schematic diagram for the comparator in FIG. 3(*e*). Pairs of the sub-PLA input signals (I8, I9, . . . , Ic) and their corresponding latched input signals (I8s, I9s, . . . , Ics) are compared by XOR gates (371). The outputs of those XOR gates are connected to the gates of n-channel MOS transistors (Mm8, Mm9, . . . , Mmc). The signal DRSL sent from the SMI logic circuit is connected to an n-channel transistor Mm. The sources of these n-channel transistors (Mm8, Mm9, . . . , Mmc, Mm) are connected together to the drain of an n-channel transistor (MmN). Their drains are connected together to the drains of two p-channel transistors (MmP, MP4) and the input of an inverter (373). The output of the inverter (PG#1) is connected to the gate of MP4. The source of MP4 is connected to Vcc. The source of MmP is also connected to Vcc. The gate of MmP is connected to the comparator enable signal (CMPEN), which is also connected to the gate of MmN. The source of MmN is connected to ground. The circuit in FIG. 3(*g*) is a domino comparator. After the comparator is enabled by CMPEN, its output PG#1 is high if there is any mismatch between the latched input signals and the incoming input signals, or if the sub-PLA output latches (341–344) have been reset since last time the sub-PLA were activated. The rising edge of PG#1 activates the first sub-PLA (331), and starts the logic evaluation procedures. On the other word, the sub-PLA is activated only when its latched outputs are no longer correct. Otherwise the sub-PLA will not consume any power. The PLA activity control circuits (337–339) for the remaining sub-PLA's are designed in similar ways as the one in FIG. 3(*e*); each individual sub-array has different SMI and different number of inputs as determined by previous simplification procedures (L1–L2). The output circuits in FIG. 3(*d*) assures the final outputs of all the sub-PLA's are identical to the outputs of the prior art PLA in FIG. 1(*f*). In the mean time, each sub-PLA can be activated individually. In most cases, only a small part of the entire PLA is activated. There is no waste in power.

FIG. 3(*h*) shows the timing relationships between the critical signals of the PLA in FIGS. 3(*c–g*). Before time Tst', the PLA is at idle state; the PLA enable signal (PLARD) is low; the comparator enable signals (CMPEN) in all sub-PLA's are low, and all the sub-PLA pre-charge signals (PG#1–PG#4 and PG1#1–PC#4) are low. The output latches in all sub-PLA's retain the results of a previous PLA operation (Li1–Li4, i=1, 2, . . . , 8). At time Tst', the PLA enable signal PLARD is pulled high to start a logic calculation. The SMI logic circuits in all sub-PLA's determines whether their comparators should be enabled, and pull CMPEN high if necessary. The enabled comparators compare the new input signals to previous input signals for those sub-PLA's, and activate corresponding sub-PLA pre-charge signals (PG#1–PG#4) selectively. The outputs (Ak1) of the activated sub-PLA AND arrays are ready shortly after pre-charge signals are activated. The pre-charge signals (PG1#1–PG1#4) for the OR array of the activated sub-PLA's are activated at time Tr' in FIG. 3(*h*). The sub-PLA OR array output lines (Om1–Om4) are ready shortly after the pre-charge signals are activated, and the output latches are opened. The outputs of the output latches (Li1–Li4) are ready at time Td'. The PLA output enable signal (OEN) is activated at time Tdo', and the final outputs of the PLA (OUTi) are ready shortly after. At time Trst', PLARD is deactivated, and all the signals return to their steady state values at time Te'. The output latches of all sub-PLA contain the right outputs for the last PLA operation, and the input latches latch the latest input data. The PLA and all of its sub-PLA's are ready for the next activity.

While specific embodiments of the invention have been illustrated and described herein, it is realized that other modifications and changes will occur to those skilled in the art. It should be understood that the above particular examples are for demonstration only and are not intended as limitation on the present invention. For example, the SMI logic results can be implemented as one input line in the AND array of the sub-PLA if SML value is applied on the input line. A sub-PLA maybe simplified to the extent that the remaining logic can be implemented by combination logic circuits. There are many alternative methods to design the comparators and the sub-PLA control circuits. Similar procedures are equally valid for PLA's with NOR-NAND arrays or PLA's with other types of logic combinations. In the above example, the input/output signals of the latest PLA operation are latched. It maybe beneficial to store the input/output signals of a previous PLA operation instead of those belonging to the latest operation.

It is a common practice for IC designers to divide a prior art PLA into smaller PLA's. The procedure is to find a subset of input/output signals that are nearly independent to the rest of input/output signals, and separate those input/output signals to build another PLA. The practice, when executed properly, often results in smaller area and better performance. However, those prior art methods are completely different from methods of the present invention. The present invention partitions minterms according to their similarity, and place most similar minterms in the same sub-PLA. The results from those sub-PLA's are combined to supply the final results. Power saving is achieved by the PLA activity control circuits capable of activating individual sub-PLA's selectively. There is no requirement in the relationship between input/output signals for successful partitioning of sub-PLA's of the present invention. We do not need to find a sub-set of input/outputs that are nearly independent of other input/output signals. The structures of individual sub-PLA's are optimized to have minimum power consumption. Latches are placed at the outputs of sub-PLA so that the sub-PLA does not need to consume power when a logic operation does not change its outputs. PLA's of the present invention is novel from prior PLA's in both design methods and in physical structures.

Step 7: Calculate power, speed, and total area of the above PLA design. The PLA designed by the above method is highly predictable. All the parameters can be calculated with high accuracy using CAD tools. The physical layout is completely defined by CAD tools automatically, so that we will be able to know the exact area of the PLA. The speed of the PLA is a function of the sizes of the sub-PLA's. There is no need for detailed simulation for individual cases. The relationship between the size and the speed of PLA's can be calibrated with high accuracy. The power consumed by the PLA is related to the partition of sub-PLA's. The power consumption (Pw) for a sub-PLA is $$Pw=Pws+Pr*Pwr+Pc*Pwc+Pa*Pwa \qquad (5)$$

where Pws is the power consumed by the sub-PLA when there is no activity, Pr is the probability when the SMI logic calculation result is low, Pwr is the power consumed by the sub-PLA to reset its output latches, Pc is the probability when the SMI logic calculation result is high but the comparator shows that there is no need to activate the sub-PLA, Pwc is the power required to turn on the comparator in the sub-PLA, Pa is the probability that the sub-PLA is activated, and Pwa is the power required to turn on the sub-PLA for logic calculation. In reality, Pwa is many orders of magnitudes higher than Pws, Pwr, or Pwc so that the actual power consumption is dominated by the last term as Pw~Pa*Pwa. We activate the sub-PLA only when both the SMI calculation and the input comparison are requiring new operation, which is a small probability. In addition, the sizes of the sub-PLA have been reduced significantly by the simplification procedures. The power consumption is therefore many orders of magnitudes smaller than equivalent prior art PLA's.

Once the power, speed, and area of the PLA have been determined, the IC designers can determine whether the results meet their requirements. If not, the designers can change control parameters and go back to Step 3 to start another optimization until all requirements are met, as shown by the flowchart in FIG. 2(*a*).

Comparing to prior art logic circuits, PLA's of the present invention have the following advantages:

The present invention divides a large PLA into a plurality of smaller sub-PLA's. Each individual sub-PLA is controlled independently, and it is activated only when its latched outputs are no longer valid for a required operation. A sub-PLA operation is bypassed when (a)incoming input signals matches with previous input signals that generated the latched output signals, or when (b)the outputs of the incoming input signal can be generated using the reset signal of the output storage latches. The probability to require full power for a sub-PLA operation is reduced significantly by those bypassing procedures. For most of cases, only a small portion of the overall PLA circuits are consuming power. On the other word, PLA's of the present invention have the power consumption characteristics of gate array logic circuits. They consume much lower power than prior are PLA's, and they do not consume any power at idle states.

A PLA of the present invention requires additional areas for the PLA output circuits and the PLA activity control logic circuits. On the other hand, the programmable arrays in its sub-PLA's are smaller because of the minterm simplifications made possible by partition methods of the present invention. For most cases, the overall areas for PLA's of the present invention are smaller than equivalent prior art PLA's.

Due to smaller and simpler structures of sub-PLA's, the present invention improves the overall performance.

Figure 4A:
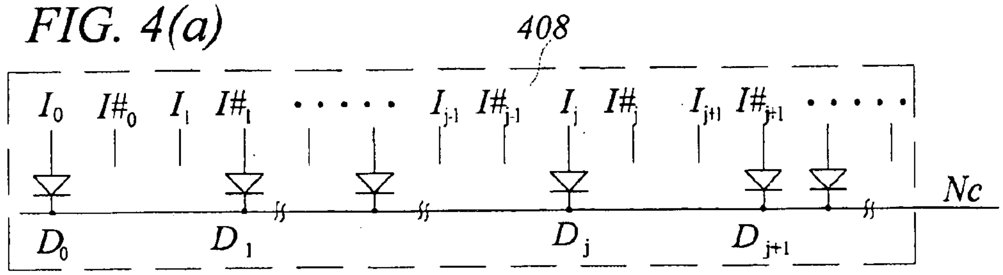
FIGS. 4(*a–c*) illustrate PLA minterms using thin film diodes.
Figure 4B:
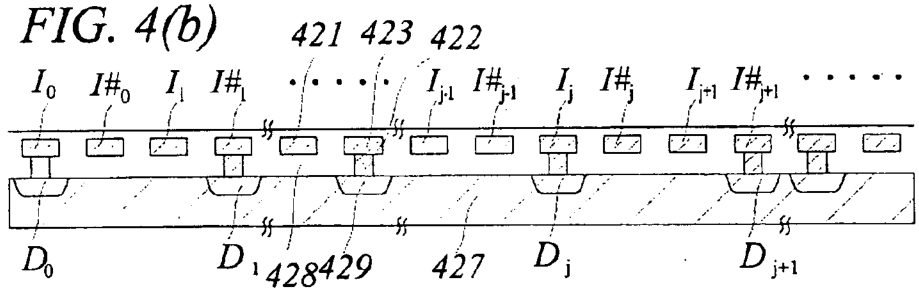
Figure 4C:
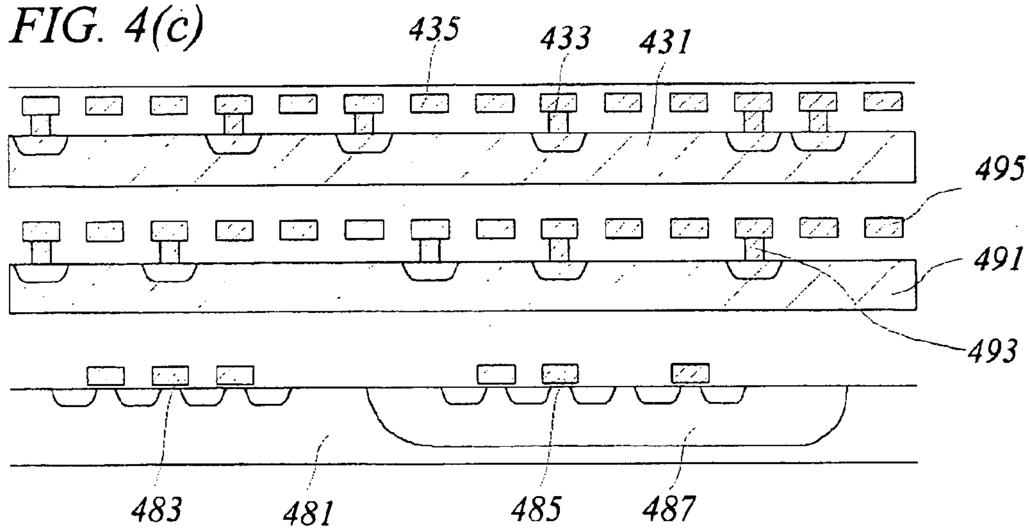

The present invention reduces the number of connections in each input/output lines of programmable logic arrays. It is therefore possible to use diodes instead of transistors in the programmable array for cost reduction. FIG. 4(*a*) shows the schematic diagram for a PLA minterm of the present invention implanted using diodes instead of transistors. The PLA input signals ($I_0$, $I_1$, . . . $I_{j-1}$, $I_j$, $I_{j+1}$, . . . ) and their complemented input signals ($I\#_0$, $I\#_1$, . . . $I\#_{j-1}$, $I\#_j$, $I\#_{j+1}$, . . . ) are selectively connected to the positive terminals of diodes ($D_0$, $D_1$, . . . , $D_j$, $D_{j+1}$, . . . ). The positive terminals of those diodes are all connected to an output line (Nc) that is pre-charged at idle state. For this example, the output note Nc is pulled high if any one of the connected inputs ($I_0$, $I\#_1$, . . . $I_j$, $I\#_{j+1}$, . . . ) is pulled high, so that it provides a logic OR operation. FIG. 4(*b*) is a cross-section diagram showing the physical structures of the input circuits (408) in FIG. 4(*a*). The input signals ($I_0$, $I_1$, . . . $I_{j-1}$, $I_j$, $I_{j+1}$, . . . , $I\#_0$, $I\#_1$, . . . $I\#_{j-1}$, $I\#_j$, $I\#_{j+1}$, . . . ) in FIG. 4(*a*) are conductor lines 9421, 423 in FIG. 4(*b*). These conductor lines can be metal lines or poly lines. The output note Nc in FIG. 4(*a*) is an n-type semiconductor substrate (427) in FIG. 4(*b*). This substrate (427) can be a poly semiconductor layer or a diffusion area in single crystal substrate. If an input line (421) is separated from the substrate (427) by thick insulator layer (428), then that input line (421) does not have a connection to the substrate. If an input line (423) is connected to the substrate (427) by a contact (429), then that input line is connected to the substrate through a diode. In these ways, the structures shown in FIG. 4(*b*) support the same function as the input circuit (408) shown in FIG. 1(*a*). There are many ways to form diode connections. If the material in the contact (429) is metal, a Schottky diode is formed between the contact metal and the n-type substrate (427). If the material filled in the contact (429) is opposite type semiconductor, then a junction diode is formed. Similar structures are also applicable on p-type substrates as soon as the polarity of diodes are reversed.

The above approach uses diodes to replace the function of transistors to achieve smaller area. Usually the reverse bias leakage current of diodes will cause functional or yield problems for PLA diode arrays. The present invention provides methods to cut large PLA array into small arrays, and effective remove those problems. A major advantage for the diode arrays of the present invention is that we do not need to use single crystal semiconductor as the substrate. It is therefore practical to build input circuits of the present invention on lower quality substrates. FIG. 4(*c*) shows the cross-section view of a three-dimensional (3D) device of the present invention using poly semiconductor substrates. In this example, there are two layers of poly semiconductor substrates (431, 491). Conductor lines (433, 435) are placed on top of one poly substrate (431) to form diode arrays of the present invention similar to the structure shown in FIG. 4(*b*). Another set of conductor lines (493, 495) are placed on top of another poly substrate (491) to form similar coupling circuits of the present invention. On the single crystal semiconductor substrate (481) we still can have prior art transistors (483, 485) sharing the same area as coupling circuits of the present invention. Typical n-channel transistors (483) and p-channel transistors in n-well (487) are shown in the example in FIG. 4(*c*). Diode arrays of the present invention also can be placed on the single crystal substrate (not shown in this figure). Such 3D device can achieve device density many times higher than prior art IC.

The design procedures of the present invention, including optimization, calibration, and physical layout, are completely executed by CAD tools automatically. The procedures are extremely user-friendly. These results are much more reliable than those obtained by current art logic design methodologies. For most cases, the design time for a product of the present invention is significantly less than that of equivalent prior art products.

The advantages of the present invention make it possible to support large scale products equivalent to GA logic with millions of gates. The regular structures of PLA and the simplicity in connections allow us to avoid RC effects. We are able to achieve full performance improvement as IC technologies continue to progress into smaller and smaller critical dimensions.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

I claim:

1. A programmable logic array (PLA) comprising:

a plurality of sub-program logic arrays (sub-PLAs) comprising at least a diode wherein at least one of said sub-PLAs includes a share-midterm-input (SMI) logic-bypass circuit for calculating a common logic truth value to conditionally provide a predefined sub-PLA vector without activating said sub-PLA.

2. A programmable logic array (PLA) comprising:

a plurality of sub-program logic arrays (sub-PLAs) comprising at least a diode wherein at least one of said sub-PLAs includes an input comparator for comparing a set of new inputs to said sub-PLA with a set of most recent inputs for said sub-PLA and to activate said sub-PLA only when said set of new inputs are different from said set of most recent inputs.

3. A programmable logic array (PLA) comprising:

a plurality of sub-program logic arrays (sub-PLAs) comprising at least a diode wherein each of said sub-PLAs includes an array of logic-operation circuits and a plurality of input and output lines;

everyone of said input lines connected to a unique set of said logic-operation circuits whereby each of said input lines connected to a different set of logic-operation circuits from every other input lines.

4. A programmable logic array (PLA) comprising:

a plurality of sub-program logic arrays (sub-PLAs) comprising at least a diode wherein each of said sub-PLAs includes an array of logic-operation circuits and a plurality of input and output lines; and everyone of said output lines connected to a unique set of said logic-operation circuits whereby each of said output lines connected to a different set of logic-operation circuits from every other output lines.

* * * * *